United States Patent [19]
Gardner et al.

[11] Patent Number: 5,926,693
[45] Date of Patent: Jul. 20, 1999

[54] TWO LEVEL TRANSISTOR FORMATION FOR OPTIMUM SILICON UTILIZATION

[75] Inventors: Mark I. Gardner, Cedar Creek; Fred N. Hause, Austin; Jon D. Cheek, Round Rock, all of Tex.

[73] Assignee: Advanced Micro Devices, Inc, Sunnyvale, Calif.

[21] Appl. No.: 08/788,376

[22] Filed: Jan. 27, 1997

[51] Int. Cl.$^6$ .................................................. H01L 21/00
[52] U.S. Cl. ........................... 438/67; 438/145; 438/152; 438/175
[58] Field of Search ............................... 438/67, 66, 142, 438/145, 152, 175; 257/330, 301

[56] References Cited

U.S. PATENT DOCUMENTS 5,672,891  9/1997  Hammamoto et al. ................. 257/301
5,796,143  8/1998  Fulford, Jr. et al. .................... 257/330

*Primary Examiner*—Charles Bowers
*Assistant Examiner*—Craig Thompson
*Attorney, Agent, or Firm*—Kevin L. Daffer; Conley, Rose & Tayon

[57] ABSTRACT

A semiconductor process in which a trench transistor is formed between a pair of planar transistors such that the source/drain regions of the trench transistor are shared with the source/drain regions of the planar transistors. A substrate is provided and first and second planar transistors are formed upon the upper surface of the substrate. The gate dielectric of the trench transistor is vertically displaced below the upper surface of the substrate. The trench transistor shares a first shared source/drain structure with the first planar transistor and a second shared source/drain structure with the second planar transistor. The formation of the trench transistor preferably includes the steps of etching a trench into the substrate, thermally oxidizing a floor of the trench to form a trench gate dielectric, and filling the trench with a conductive material to form a trench gate structure. The trench floor is vertically displaced below the upper surface of the substrate by a trench depth. The trench depth is preferably greater than a junction depth of the source/drain structures. In one embodiment, the formation of the trench transistor further includes, prior to the thermal oxidation of the trench floor, forming first and second ldd structures within the first and second trench ldd regions of the substrate. The first and second trench ldd structures provide conductive paths that extend from a trench channel region located beneath the trench floor to the first and the second shared source/drain structures respectively.

9 Claims, 2 Drawing Sheets

TWO LEVEL TRANSISTOR FORMATION FOR OPTIMUM SILICON UTILIZATION

BACKGROUND OF THE INVENTION

1. Field of the Invention

The present invention relates to the field of semiconductor processing, and more particularly to a method for improving silicon utilization by incorporating a vertically displaced trench transistor between a pair of conventional planar transistors.

2. Description of the Related Art

Integrated circuits are widely employed in a variety of electronics applications to produce complex electronics circuits on an extremely small area of a monolithic semiconductor substrate, such as silicon. Universally recognized for their low cost, high speed, low power dissipation, and high reliability, semiconductor integrated circuits long ago replaced discreet components as the predominant and preferred electronic devices. World-wide sales of integrated circuits have increased exponentially since the early 1960s. During this time, semiconductor manufacturers have striven to reduce the cost and increase the complexity of integrated circuits by fabricating an ever larger number of transistors on a given area of the semiconductor substrate. The predominant method of achieving this goal has been reducing the size of the individual transistors that comprise the integrated circuit. Smaller transistors enable the fabrication of more complex and smaller devices. Smaller devices have the dual benefits of increasing the number of devices manufacturable on a single semiconductor wafer and increasing the probability that any individual device on a given silicon wafer will be free of random fatal defects. Since the early 1960s, when the average feature size or design rule within the industry was approximately 25 microns, the average design rule has decreased rather steadily by approximately 11% per year. The average design rule dropped below one micron in the mid 1980s, and has been decreasing steadily since then.

In addition to the size of the transistors themselves, the amount of area required to isolate individual transistors from one another limits the transistor density i.e., the number of transistors per unit area. Referring to FIG. 1, a conventional integrated circuit is shown in which a first transistor 10 and a second transistor 12 are fabricated on a semiconductor substrate 8. To isolate first transistor 10 from second transistor 12, an isolation structure such as shallow trench isolation structure 14 is required to prevent the inadvertent coupling of source/drain regions 16 of first transistor 10 and source/drain region 18 of second transistor 12. The lateral dimension $d_L$ of isolation structure such as shallow trench isolation structure 14 limits the density of transistors that can be fabricated over a given area of substrate 8. As a rule of thumb, the minimum lateral dimension $d_L$ necessary to adequately ensure proper isolation between source/drain region 16 of first transistor 10 and source/drain region 18 of second transistor 12 is approximately equal to the lateral dimension $L_t$ of first transistor 10. Shallow trench isolation structure 14 occupies a region of substrate 8 that could otherwise be devoted to the formation of active transistors and represents a limitation on the achievable transistor density. It would, therefore, be highly desirable to implement a circuit design and fabrication technique to reduce or eliminate the percentage of substrate 8 occupied by isolation regions 14.

SUMMARY OF THE INVENTION

The problems outlined above are in large part addressed by a semiconductor process in which a trench transistor is formed between a pair of planar transistors such that the source/drain regions of the trench transistor are shared with the source/drain regions of the planar transistors. By forming a trench transistor vertically displaced from the pair of planar transistors and by sharing the source/drain regions, the number of transistors manufactured on a given silicon area is maximized.

Broadly speaking, the present invention contemplates a semiconductor process in which a semiconductor substrate is provided and first and second planar transistors are formed upon the upper surface of the semiconductor substrate. The second planar transistor is laterally displaced from the first planar transistor. A trench transistor is then formed between the first planar transistor and the second planar transistor. The gate dielectric of the trench transistor is vertically displaced below the upper surface of the semiconductor substrate. The trench transistor shares a first shared source/drain structure with the first planar transistor and a second shared source/drain structure with the second planar transistor.

The semiconductor substrate preferably comprises a p-type epitaxial layer formed on a p+ silicon bulk. A preferred resistivity of the epitaxial layer is in the range of approximately 10 to 15 $\Omega$-cm. In a presently preferred embodiment, the formation of the first and second planar transistors is accomplished by forming a surface gate dielectric upon the upper surface of the semiconductor substrate, forming first and second conductive gate structures on the surface gate dielectric, and forming source/drain structures. The first and second conductive gate structures are aligned over first and second channel regions of the semiconductor substrate. The source/drain structures are laterally disposed on either of the first channel region and on either side of the second channel region. In a presently preferred embodiment, the surface gate dielectric is formed by thermally oxidizing the upper surface of the semiconductor substrate to produce an oxide film. In one embodiment, the first and second conductive gate structures are made of heavily doped polysilicon. In another embodiment, the first and second conductive gate structures are made of a metal such as copper, aluminum, tungsten, or an alloy thereof. The formation of the source/drain structures is preferably achieved by implanting ions of boron, phosphorous, or arsenic into source/drain regions of the semiconductor substrate. The source/drain regions of the semiconductor substrate are laterally displaced on either side of the respective channel regions.

The formation of the trench transistor preferably includes the steps of etching a trench into the semiconductor substrate, thermally oxidizing a floor of the trench to form a trench gate dielectric, and filling the trench with a conductive material to form a trench gate structure. The trench includes a trench floor extending between a pair of trench sidewalls. The trench floor is vertically displaced below the upper surface of the semiconductor substrate by a trench depth. The trench depth is preferably greater than a junction depth of the source/drain structures. In one embodiment, the formation of the trench transistor further includes, prior to the thermal oxidation of the trench floor, forming first and second trench ldd structures within the first and second trench ldd regions of the semiconductor substrate. The first and second trench ldd structures provide conductive paths that extend from a trench channel region located beneath the trench floor to the first and the second shared source/drain structures respectively. The formation of the first and second trench ldd structures preferably includes the steps of introducing a trench ldd impurity distribution into the trench channel region and the first and second trench ldd regions, forming a pair of trench spacer structures on the sidewalls of the trench such that the spacer structures extend laterally from the sidewalls to respective channel boundaries of the first and second trench ldd regions leaving the trench channel region exposed. Thereafter the trench channel region is counter doped with a trench channel impurity distribution to electrically isolate the first trench ldd region from the second trench ldd region.

The present invention further contemplates an integrated circuit. The integrated circuit includes a semiconductor substrate, a first planar transistor formed on an upper surface of a first transistor region of the semiconductor substrate, a second planar transistor formed on an upper surface of a second transistor region of the semiconductor substrate, and a trench transistor. The first planar transistor is laterally displaced from the second planar transistor. The trench transistor includes a trench gate dielectric that is vertically displaced below and upper surface of the semiconductor substrate. The trench transistor shares a first source/drain structure with the first planar transistor. The trench transistor shares a second shared source/drain structure with the second planar transistor.

The first and second transistors each preferably include a conductive gate structure formed on a gate dielectric and a pair of source/drain structures. The conductive gate structure is aligned over a respective channel region of the semiconductor substrate. The pair of source/drain structures are formed within respective source/drain regions of the semiconductor substrate. The source/drain regions are laterally disposed on either side of the channel region. In one embodiment, the conductive gate structure is heavily doped polysilicon. In an alternative embodiment, the conductive gate structure is a metal such as aluminum, copper, tungsten, or an alloy thereof. Each source/drain structure preferably includes an impurity distribution of arsenic, phosphorous, or boron. The peak impurity concentration within the source/drain structures is ideally greater than approximately $1\times10^{19}$ atoms/cm$^3$. The gate dielectric is preferably a thermal oxide.

The trench transistor of the integrated circuit, in one embodiment, further includes a conductive trench gate structure formed on the trench gate dielectric, a trench channel region, and first and second trench ldd structures. The trench channel region is located within the semiconductor substrate below the trench gate dielectric and aligned with the trench gate. The first and second trench ldd structures extend from respective ldd boundaries of the trench channel region to the first and second shared source/drain regions, respectively.

The conductive trench gate is preferably comprised of heavily doped polysilicon in a first embodiment. In a second embodiment, the conductive trench gate includes a metal such as copper, aluminum, tungsten, or an alloy thereof. The first and second trench Idd structures ideally include first and second trench ldd impurity distributions. The ldd impurity distributions are substantially contained within first and second ldd regions respectively of the semiconductor substrate. Ideally, the first and second ldd impurity distribution comprises distributions of boron, phosphorous, or arsenic. A peak concentration of the first and second ldd impurity distributions is, in one embodiment, less than approximately $1\times10^{18}$ atoms/cm$^3$.

BRIEF DESCRIPTION OF THE DRAWINGS

Other objects and advantages of the invention will become apparent upon reading the following detailed description and upon reference to the accompanying drawings in which.

Figure 1:
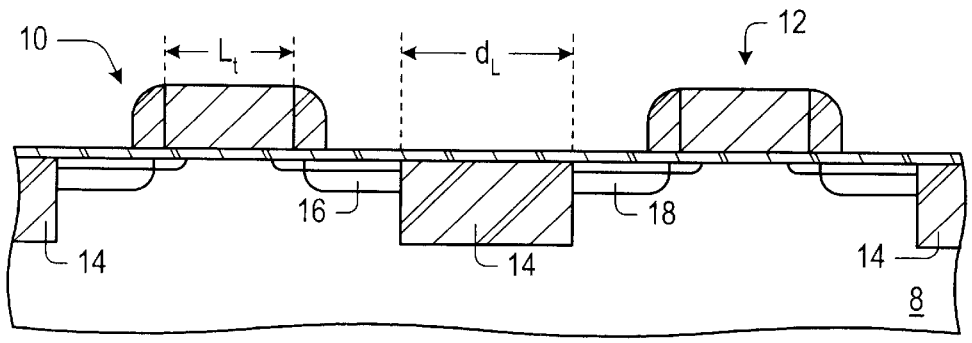
FIG. 1 is a partial cross-sectional view of an integrated circuit in which first and second transistors are laterally displaced on either side of an isolation structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
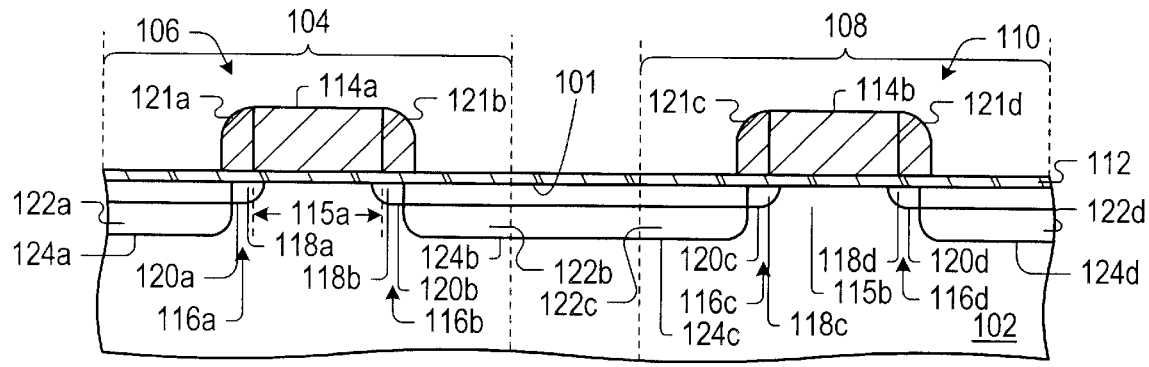
FIG. 2 is a partial cross-sectional view of a semiconductor substrate upon which a pair of planar transistors has been formed.

Turning now to the drawings, FIGS. 2 through 6 show a processing sequence for forming integrated circuit 100 (shown in FIG. 6) according to the present invention. Turning to FIG. 2, semiconductor substrate 102 is preferably comprised of single crystal silicon and still more preferably comprises a p-type epitaxial layer formed on a p+ silicon bulk (for purposes of this disclosure a p+ or n+ designation refers to a doping concentration greater than approximately $1\times10^{19}$ atoms/cm$^3$. The preferred resistivity of the p-type epitaxial layer is in the range of approximately 10 to 15 Ω-cm. First planar transistor 106 and second planar transistor 110 are formed on an upper surface 101 of first transistor region 104 and second transistor region 108 respectively of semiconductor substrate 102. Second transistor 110 is laterally displaced from first transistor 106. The formation of first planar transistor 106 and second planar transistor 110 is accomplished in the preferred embodiment by forming surface gate dielectric 112 upon upper surface 101 of semiconductor substrate 102, forming first and second conductive gate structures 114a and 114b respectively on surface gate dielectric 112. First and second conductive gate structures 114a and 114b are formed such that they are aligned over first and second channel regions 115a and 115b respectively of semiconductor substrate 102. After the formation of the first and second conductive gate structures 114a and 114b, a first pair of source/drain structures 116a and 116b and a second pair of source/drain structures 116c and 116d are formed. The first pair of source/drain structures 116a and 116b are laterally disposed on either side of first channel region 115a while the second pair of source/drain structures 116c and 116d are laterally disposed on either side of second channel region 115b.

In one embodiment, source/drain structure 116b of first transistor 106 and source/drain structure 116c of second transistor 110 may comprise a single common source/drain structure shared by first transistor 106 and second transistor 110. In the embodiment shown in FIG. 2, all of the source/drain structures 116 include a lightly doped impurity distribution 118 substantially contained within a lightly doped region 120 and a heavily doped impurity distribution 122 substantially contained within a heavily doped impurity distribution 124. Typically, lightly doped impurity distribution 118 and heavily doped impurity distribution 122 comprise a distribution of phosphorous, arsenic, or boron atoms. Typical peak concentration values of lightly doped impurity distribution 118 are less than approximately $1 \times 10^{18}$ atoms/cm$^3$ while typical peak impurity concentrations of heavily doped impurity distribution 122a exceed approximately $1 \times 10^{19}$ atoms/cm$^3$. As seen in FIG. 2, lightly doped impurity distribution 118 typically extends laterally to the channel region 115 while heavily doped impurity distribution 122 typically does not extend laterally to channel 115. In addition, heavily doped impurity distribution 122 is typically implanted at a higher energy than lightly doped impurity distribution 118 such that a depth of heavily doped impurity distribution 122 below upper surface 101 of semiconductor substrate 102 is typically greater than the depth of lightly doped impurity distribution 118. As is well known, the formation of lightly doped and heavily doped impurity distributions is facilitated by implanting the lightly doped impurity distribution 118 prior to the formation of spacer structures 121 upon the sidewalls of conductive gate structure 114. After the formation of the spacer structures, heavily doped impurity distribution 122 is implanting into the semiconductor substrate.

Conductive gate structure 114 may comprise, in one embodiment, heavily doped polysilicon (for purposes of this disclosure heavily doped polysilicon refers to polysilicon having a sheet resistivity less than approximately 500 Ω/square). In another embodiment, conductive gate structures 114 may comprise a metal such as aluminum, copper, tungsten, or an alloy thereof. The formation of conductive gate structures 114 includes the well known steps of depositing conductive material and patterning the conductive material with a photolithographic process. In an embodiment in which the conductive gate structures 114 are polysilicon, the deposition of the conductive gate layer is typically accomplished by thermally decomposing silane within a chamber maintained at a temperature of less than approximately 680° C. and a pressure of less than approximately 2 torrs. After the formation of conductive gate structures 114 and the formation of the lightly doped impurity distributions 118, spacer structures 121 are formed on sidewalls of conductive gate 114 by depositing a conformal dielectric material such as a CVD oxide and subsequently performing an anisotropic etch process with a minimal overetch resulting in the spacer structures 121 as shown in FIG. 1. Thereafter, the heavily doped impurity distributions 122 may be implanted into semiconductor substrate 102.

Figure 3:
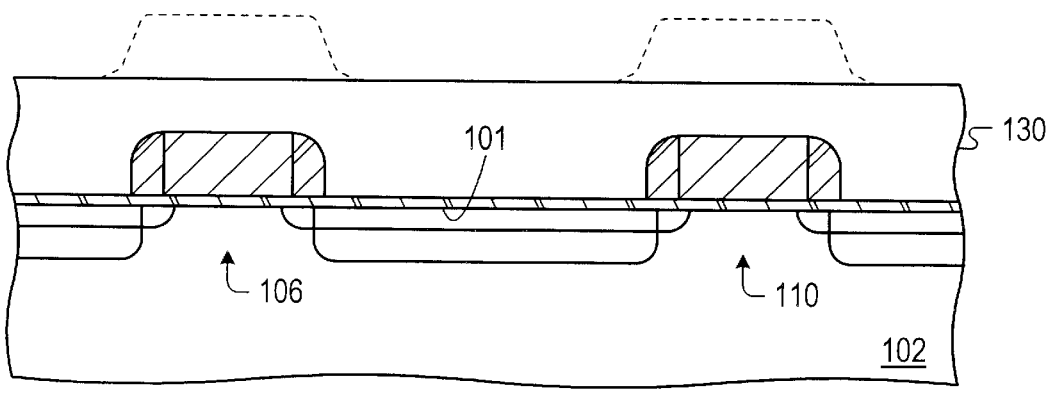
FIG. 3 is a processing step subsequent to FIG. 2 in which a dielectric layer has been deposited upon the wafer to cover the pair of transistors.

Turning now to FIG. 3, an insulating layer 130 is formed upon first transistor 106 and second transistor 110. In one embodiment, insulated layer 130 is formed by chemical vapor deposition of an oxide using a TEOS source. Subsequent to the deposition of insulating layer 130, a planarization process is preferably performed to achieve a lateral of more planar upper surface of the insulating layer 130. Portions of insulating layer 130 removed during the planarization process are shown in phantom in FIG. 3.

Figure 4:
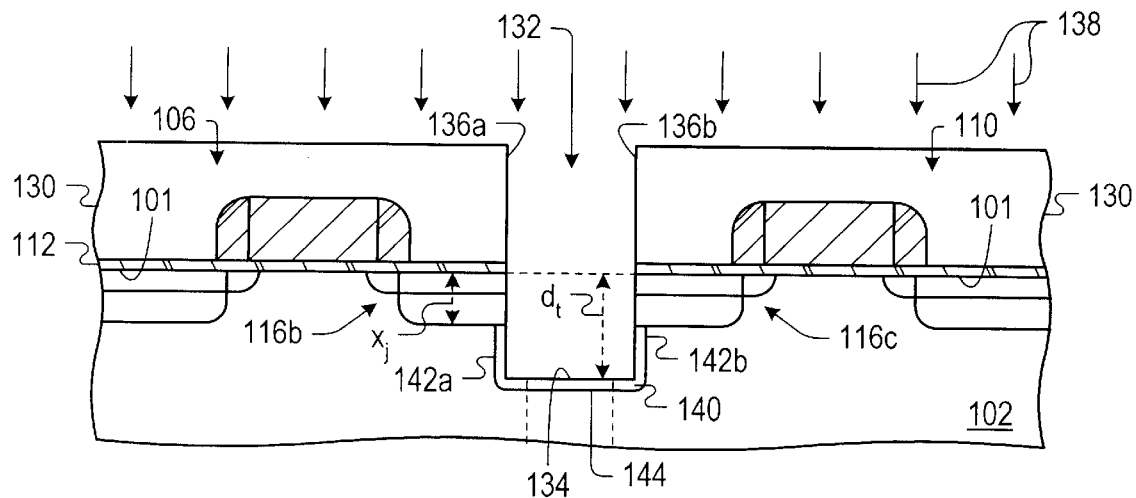
FIG. 4 is a processing step subsequent to FIG. 3 in which a trench is etched into semiconductor substrate and an impurity distribution is introduced into the region of the semiconductor substrate surrounding the base of the trench.

Turning now to FIG. 4, trench 132 is etched into insulating layer 130, through gate dielectric 112, and into semiconductor substrate 102. Trench 132 includes a trench floor 134 and a pair of trench sidewalls 136a and 136b. In the preferred embodiment, the trench floor 134 is vertically displaced along upper surface 101 of semiconductor substrate 102 by a trench depth $d_t$. Trench depth $d_t$, in a presently preferred embodiment, is greater than the junction depth $x_j$ of source/drain structures 116 such that trench 132 provides a physical and electrical separation between source/drain structure 116b of first transistor 106 and second source/drain structure 116c of second transistor 110. Subsequent to the formation of trench 132, trench ldd impurity distribution 140 is introduced into trench channel region 144, first trench ldd region 142a, and second trench ldd region 142b. The introduction of trench ldd impurity distribution 140 into semiconductor substrate 102 is preferably accomplished with an ion implantation 138. A suitable dose for ion implantation 138 is less than approximately $1 \times 10^{14}$ atoms/cm$^2$. Suitable species for ion implantation 138 include arsenic, phosphorous, and boron.

Turning now to FIG. 4, a pair of trench spacer structures 150a and 150b are formed on respective sidewalls 136a and 136b of trench 132. The formation of trench spacer structures 150a and 150b is accomplished, in the preferred embodiment, by depositing a conformal dielectric layer using a CVD process and thereafter anisotropically etching the dielectric layer. Dielectric materials suitable for trench spacer structures 150a and 150b include oxide and silicon nitride. Spacer structures 150a and 150b extend laterally from sidewalls 136a and 136b to respective channel boundaries 143a and 143b of first trench ldd region 142a and second trench ldd region 142b. In this manner, trench channel region 144a remains exposed after the formation of trench spacer structures 150a and 150b while the respective trench ldd structures 142a and 142b are covered. Thereafter, trench channel region 144a is counter-doped preferably with ion implantation 152 to electrically isolate first trench ldd structure 142a and second trench ldd structure 142b. If, for example, first planar transistor 106 and second planar transistor 110 are of the n-channel variety such that source/drain structures 116b and 116c include an n+ impurity distribution, than implant 138 (shown in FIG. 3) will introduce an n-type impurity such as phosphorous or arsenic into the trench channel region 144. To counter dope this n-type impurity distribution, implant 152 is performed with a p-type species such as boron. The counter doping of trench channel 144 isolates first trench ldd region 142a from second trench ldd region 142b. Accordingly, trench ldd impurity distribution 140 within first trench ldd region 142 and second trench ldd region 142b provide conductive paths from channel region 144 to respective source/drain regions 166b of first planar transistor 106 and 116c of second planar transistor 110.

Figure 5:
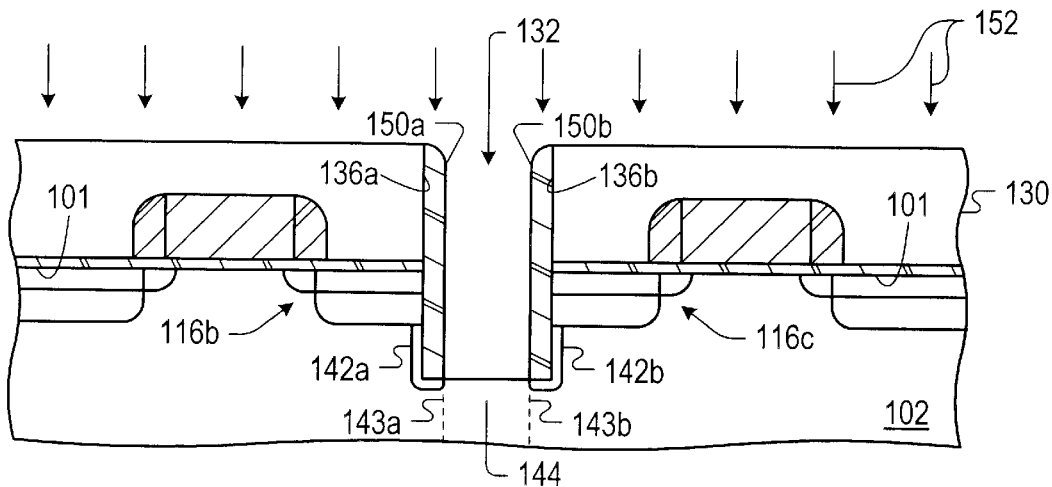
FIG. 5 is a processing step subsequent to FIG. 4 in which a pair of spacer structures is formed on the sidewalls of the trench and the trench channel region is counter-doped to electrically isolate the first trench ldd structure from the second trench ldd structure; and, FIG. 6 is a processing step subsequent to FIG. 5 in which a trench gate dielectric and a trench gate structure have been formed.
Figure 6:
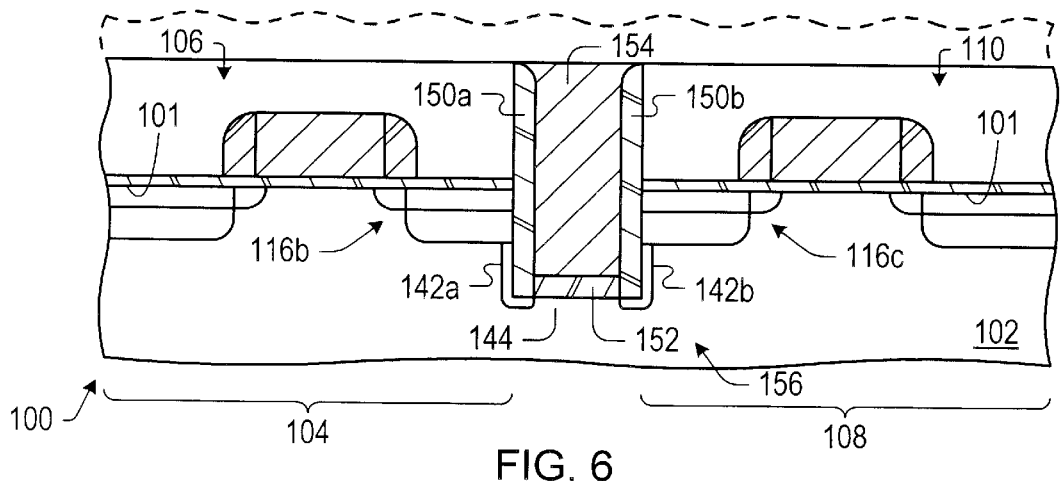

Turning now to FIG. 5, a trench gate dielectric 152 is formed upon trench floor 134 preferably with a thermal oxidation process and a conductive material is deposited upon trench gate dielectric 152 to fill trench 132. Thereafter, excess conductive material is removed from regions exterior from trench 132, preferably with a chemical mechanical polish or other planarization step, to form trench conductive gate structure 154. Trench conductive gate 154 is preferably comprised of aluminum or heavily doped polysilicon. Alternatively, conductive gate structure 154 may include tungsten, copper, or a metal alloy. As will be appreciated to those skilled in the art, the trench transistor 136 has been formed between first planar transistor 106 and second planar transistor 110. The trench transistor 156 includes a trench gate dielectric 152 vertically displaced below upper surface 101 of semiconductor substrate 102. Trench transistor 156 shares a first source/drain structure 116b with first planar transistor 106. Trench transistor 156 shares a second shared source/drain structure 116c with second planar transistor 110. The sharing of first and second shared source/drain structures 116b and 116c is accomplished by first and second trench ldd structures 142a and 142b respectively, which extend from respective ldd boundaries of trench channel region 144 to the first and second shared source/drain regions 116b and 116c. In this manner, the first and second trench ldd structures 142a and 142b provide conductive paths to first and second shared source/drain structures 116b and 116c. Applying an appropriate bias (i.e., a positive voltage in the case of an n-channel trench transistor) to trench gate structure 154 induces a channel in trench channel region 144 permitting current to flow between first shared source/drain region 116b and second shared source/drain structure 116c upon application of a source-to-drain bias. Accordingly, three transistors are formed within a space previously occupied by just two transistors. Through vertical displacement of the gate dielectric and sharing of the source/drain regions silicon utilization is thereby optimized.

Thus, FIG. 5 shows an integrated circuit 100 comprising a first planar transistor 106 formed on an upper surface 101 of first transistor region 104 of semiconductor substrate 102. Integrated circuit 156 further includes second planar transistor 108 formed on upper surface 101 of second transistor region 108 of semiconductor substrate 102. Second planar transistor 110 is laterally displaced from first planar transistor 106. Integrated 156 further includes trench transistor 156. Trench transistor 156 includes trench gate dielectric 144 vertically displaced below upper surface 101 of semiconductor substrate 102. Trench transistor 156 shares first source/drain structure 116b with first planar transistor 106 and second source/drain structure 116c with second planar transistor 110. In the preferred embodiment, trench transistor 156 further includes a trench conductive gate structure 154 formed between a pair of trench spacer structures 150a and 150b. A first trench ldd structure 142a and a second trench ldd structure 142b provide conductive paths extending from trench channel region 144 to respective shared source/drain regions 116b and 116c.

It would be appreciated to those skilled in the art to having the benefit of this disclosure that this invention contemplates a method and structure for optimizing utilization of silicon surface by vertically displacing an intermediate transistor between a pair of planar transistors. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A semiconductor process comprising:
   providing a semiconductor substrate;
   forming a first planar transistor and a second planar transistor upon first and second transistor regions respectively of said semiconductor substrate, wherein said second planar transistor is laterally displaced from said first planar transistor; and
   forming a trench transistor between said first planar transistor and said second planar transistor, wherein a gate dielectric of said trench transistor is vertically displaced below said upper surface of said semiconductor substrate, and wherein said trench transistor shares a first shared source/drain structure with said first planar transistor and a second shared source/drain structure with said second planar transistor.

2. The process of claim 1, wherein said semiconductor substrate comprises a p-type epitaxial layer formed on a p+ silicon bulk and wherein a resistivity of said epitaxial layer is in the range of approximately 10 to 15 Ω-cm.

3. The process of claim 1, wherein the step of forming said first and second planar transistor comprises:
   forming a surface gate dielectric upon an upper surface of said semiconductor substrate;
   forming first and second conductive gate structures on said surface gate dielectric, wherein said first and second conductive gates structures are aligned over first and second channel regions respectively of said semiconductor substrate; and
   forming source/drain structures laterally disposed on either side of said first channel region and on either side of said second channel region.

4. The process of claim 3 wherein the step of forming said surface gate dielectric comprises thermally oxidizing said upper surface of said semiconductor substrate.

5. The process of claim 3 wherein said first and second conductive gate structures comprise heavily doped polysilicon.

6. The process of claim 3 wherein the step of forming said source/drain structures comprises implanting ions selected from the group consisting of boron, phosphorous, and arsenic into source/drain regions of said semiconductor substrate.

7. The process of claim 1 wherein the step of forming said trench transistor comprises:
   etching a trench into said semiconductor substrate between said first and said second transistor regions, wherein said trench comprises a trench floor extending between a pair of trench sidewalls, and wherein said trench floor is vertically displaced below said upper surface of said semiconductor substrate by a trench depth, further wherein said trench depth is greater than a junction depth of said source/drain structures;
   thermally oxidizing said trench floor to form a trench gate dielectric; and
   filling said trench with a conductive material to form a trench gate structure.

8. The process of claim 7, further comprising, prior to the step of thermally oxidizing said trench floor, forming first and second trench ldd structures within first and second trench ldd regions respectively of said semiconductor substrate, wherein said first and second trench ldd structures provide conductive paths extending from a trench channel region located beneath said trench floor to said first and said second shared source/drain structures respectively.

9. The process of claim 8, wherein the step of forming said first and said second trench ldd structures comprises:
   introducing a trench ldd impurity distribution into said trench channel region and said first and second trench ldd regions;
   forming a pair of trench spacer structures on respective said pair of trench sidewalls, wherein said spacer structures extend laterally from said sidewalls to respective channel boundaries of said first and said second trench ldd regions such that said trench channel region remains exposed; and
   counter-doping said trench channel region with a trench channel impurity distribution to electrically isolate said first trench ldd region from said second trench ldd region.

* * * * *